US011327412B2

(12) United States Patent
Hugers et al.

(10) Patent No.: US 11,327,412 B2
(45) Date of Patent: May 10, 2022

(54) TOPOGRAPHY MEASUREMENT SYSTEM

(71) Applicant: ASML NETHERLANDS B.V., Veldhoven (NL)

(72) Inventors: Ronald Franciscus Herman Hugers, Best (NL); Martinus Cornelis Reijnen, Tilburg (NL); Paulus Antonius Andreas Teunissen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 598 days.

(21) Appl. No.: 16/061,947

(22) PCT Filed: Nov. 30, 2016

(86) PCT No.: PCT/EP2016/079178
§ 371 (c)(1),
(2) Date: Jun. 13, 2018

(87) PCT Pub. No.: WO2017/108350
PCT Pub. Date: Jun. 29, 2017

(65) Prior Publication Data
US 2018/0373171 A1    Dec. 27, 2018

Related U.S. Application Data

(60) Provisional application No. 62/375,774, filed on Aug. 16, 2016, provisional application No. 62/271,213, filed on Dec. 22, 2015.

(51) Int. Cl.
*G03F 9/00*     (2006.01)
*G01B 11/25*    (2006.01)
(Continued)

(52) U.S. Cl.
CPC .......... *G03F 9/7026* (2013.01); *G01B 11/254* (2013.01); *G01B 11/2545* (2013.01);
(Continued)

(58) Field of Classification Search
CPC .............. G01B 11/254; G01B 11/2545; G01B 2210/56; G03F 9/7026; G01N 21/17;
(Continued)

(56) References Cited

U.S. PATENT DOCUMENTS 4,558,949 A * 12/1985 Uehara .................. G03F 9/7034
                                                        250/559.38
5,216,247 A    6/1993 Wang et al.
(Continued)

FOREIGN PATENT DOCUMENTS

CN    101556438 A    10/2009
JP    63-007626       1/1988
(Continued)

OTHER PUBLICATIONS

International Search Report dated Feb. 28, 2017 issued in corresponding International Application No. PCT/EP2016/079178.
(Continued)

Primary Examiner — Steven L Yeninas
(74) Attorney, Agent, or Firm — Pillsbury Winthrop Shaw Pittman, LLP

(57) ABSTRACT

A topography measurement system includes a radiation source; a first grating; imaging optics; a movement mechanism; detection optics; a second grating; and a detector. The radiation source is configured to generate a radiation beam and includes a light emitting diode to produce to the radiation. The first grating is configured to pattern the radiation beam. The imaging optics is configured to form a first image of the first grating at a target location on a substrate. The movement mechanism is operable to move the substrate relative to the image of the first grating such that the target location moves relative to the substrate. The detection optics is configured to receive radiation from the target location of the substrate and form an image of the first image at the (Continued)

second grating. The detector is configured to receive radiation transmitted through the second grating and produce an output signal.

21 Claims, 6 Drawing Sheets

(51) Int. Cl.
G01N 21/95 (2006.01)
H01L 21/66 (2006.01)

(52) U.S. Cl.
CPC ...... G01B 2210/56 (2013.01); G01N 21/9501 (2013.01); H01L 22/12 (2013.01)

(58) Field of Classification Search
CPC ............. G01N 21/47; G01N 21/4738; G01N 21/9501; G01N 2021/4711; G01N 2021/4792
See application file for complete search history.

(56) References Cited

U.S. PATENT DOCUMENTS

| | | | |
|---|---|---|---|
| 6,961,190 B1* | 11/2005 | Tamaoki | G02B 6/322 359/726 |
| 8,654,311 B2 | 2/2014 | Sewell et al. | |
| 9,157,866 B2 | 10/2015 | Matsui et al. | |
| 2001/0015800 A1* | 8/2001 | Uda | G01N 21/8803 356/237.2 |
| 2002/0001080 A1* | 1/2002 | Miller | G01J 1/08 356/326 |
| 2002/0141181 A1* | 10/2002 | Bailey | F21S 2/00 362/150 |
| 2004/0008867 A1* | 1/2004 | Fein | G01N 21/6458 382/100 |
| 2004/0032581 A1 | 2/2004 | Nikoonahad et al. | |
| 2004/0150828 A1* | 8/2004 | Hendrix | G01N 21/55 356/445 |
| 2005/0067627 A1* | 3/2005 | Shen | H01L 33/08 257/89 |
| 2007/0114540 A1* | 5/2007 | Lee | H01L 33/08 257/79 |
| 2008/0151258 A1* | 6/2008 | Matsumoto | G01B 11/2441 356/512 |
| 2009/0091723 A1* | 4/2009 | Sasaki | G03F 9/7049 355/53 |
| 2009/0180118 A1* | 7/2009 | Feichtinger | G01N 21/55 356/402 |
| 2009/0225327 A1* | 9/2009 | Maeda | G03F 9/7026 356/496 |
| 2009/0257044 A1 | 10/2009 | Sewell et al. | |
| 2009/0262323 A1* | 10/2009 | Sasaki | G01B 9/02022 355/68 |
| 2010/0125432 A1* | 5/2010 | Sasaki | G03F 9/7026 702/150 |
| 2010/0209832 A1 | 8/2010 | Matsuda | |
| 2010/0233600 A1 | 9/2010 | Den Boef et al. | |
| 2011/0007316 A1* | 1/2011 | De Wit | G03F 7/70616 356/365 |
| 2011/0304839 A1 | 12/2011 | Beerens et al. | |
| 2013/0021588 A1* | 1/2013 | Matsumoto | G01B 11/14 355/45 |
| 2013/0148113 A1 | 6/2013 | Oku et al. | |
| 2014/0097350 A1* | 4/2014 | Reichelsheimer | B32B 37/1284 250/372 |
| 2014/0185041 A1 | 7/2014 | Matsui et al. | |

FOREIGN PATENT DOCUMENTS

| | | |
|---|---|---|
| JP | H02-188907 | 7/1990 |
| JP | H03-246411 | 11/1991 |
| JP | H05-129182 | 5/1993 |
| JP | H10-239015 | 9/1998 |
| JP | 2005-201672 | 7/2005 |
| TW | I451125 B | 9/2014 |
| TW | I505039 B | 10/2015 |
| TW | I514091 B | 12/2015 |
| WO | 2011104177 A1 | 9/2011 |

OTHER PUBLICATIONS

European Office Action Issued in corresponding European Patent Application No. 16802087.3, dated Jun. 7, 2019.
Japanese Office Action issued in corresponding Japanese Patent Application No. 2018-532680, dated May 28, 2019.
Office Action dated Sep. 25, 2019 issued in corresponding Chinese Patent Application No. 201680074778.4.
Office Action dated Apr. 15, 2020 issued in corresponding Chinese Patent Application No. 201680074778.4 with English translation.

* cited by examiner ial application no. 62/271,213, which was
TOPOGRAPHY MEASUREMENT SYSTEM

CROSS-REFERENCE TO RELATED APPLICATIONS

This application is the U.S. national phase entry of PCT patent application no. PCT/EP2016/079178, which was filed on Nov. 30, 2016, which claims the benefit of priority of U.S. provisional application No. 62/271,213, which was filed on Dec. 22, 2015, and U.S. provisional application No. 62/375,774, which was filed on Aug. 16, 2016, each of which is incorporated herein in its entirety by reference

FIELD

The present description relates to a measurement system for determining a topography of a substrate, the system including a radiation beam, the radiation source comprising a light emitting diode to provide the radiation, a first patterning device configured to pattern the radiation beam, optics configured to form an image of the first patterning device at a target location on the substrate, detection optics configured to receive radiation reflected from the target location of the substrate and form an image of the first image at a grating, and a detector configured to receive radiation transmitted through the grating and produce an output signal. The measurement system may form part of a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a second patterning device (e.g. a mask) onto a layer of radiation-sensitive material (resist) provided on a substrate (e.g. a silicon wafer).

Before a pattern is projected from the second patterning device onto a layer of radiation sensitive material provided on a substrate the topography of the substrate is measured. In order to achieve this, such a lithographic apparatus may be provided with the afore-mentioned topography measurement system. The topography measurement system measures the height of the substrate across the surface of the substrate. These height measurements can be used to form a height map which assists accurate projection of a pattern onto the substrate.

SUMMARY

It may be desirable to provide, for example, a topography measurement system which obviates or mitigates one or more of the problems of the art, whether identified herein or elsewhere.

According to an aspect, there is provided a measurement system for determining a topography of a substrate, the system comprising: a radiation source configured to generate a radiation beam, wherein the radiation source comprises a light emitting diode to provide the radiation; a first patterning device configured to pattern the radiation beam; optics configured to form an image of the first patterning device at a target location on the substrate; a movement mechanism operable to move the substrate relative to the image of the first grating such that the target location moves relative to the substrate; detection optics configured to receive radiation reflected from the target location of the substrate and form an image of the first image at a grating; and a detector configured to receive radiation transmitted through the grating and produce an output signal. The radiation provided by the light emitting diode may mainly be composed of ultraviolet radiation. The radiation provided by the light emitting diode may mainly be composed of visible radiation. The radiation provided by the light emitting diode may comprise ultraviolet radiation, visible radiation or both.

The measurement system according to this aspect may have, for example, one or more advantages. Additionally or alternatively using ultraviolet radiation, the measurement system may provide better measurement performance than visible and/or infrared radiation. Furthermore, a light emitting diode (LED), such as an ultraviolet light emitting diode, has one or more advantages over other known UV radiation sources such as gas discharge lamps (e.g. a Xenon plasma source). In particular, an LED can be switched on and off quickly and easily without significantly affecting its lifetime, which may avoid the need for a complicated shutter arrangement. Furthermore, a light emitting diode is typically less expensive and more widely available than more complicated gas discharge sources.

The radiation source may comprise a plurality of light emitting diodes. At least two of the plurality of light emitting diodes may have different wavelength spectra.

Such an arrangement allows a broad band ultraviolet source to be formed from light emitting diodes. Advantageously, such an arrangement allows for a broad band ultraviolet source to be formed wherein the wavelength spectrum can be tailored to requirements. Furthermore, it allows the spectrum of the radiation source to be adjusted by varying the relative intensities of the plurality of light emitting diodes.

It will be appreciated that each of the plurality of light emitting diodes may have a different wavelength spectrum. Alternatively, at least two of the plurality of light emitting diodes may have identical or similar wavelength spectra. Each of two or more light emitting diodes with a substantially identical spectrum may: (a) allow for some level of redundancy within the radiation source; and/or (b) allow an increased operating range of output intensities or powers for each wavelength component; and/or (c) allow each of the substantially identical light emitting diodes to operate at a lower intensity, which may increase the lifetime of the light emitting diodes. In one embodiment, the radiation source may comprise, for example, five light emitting diodes with central wavelengths of 265 nm, 280 nm, 300 nm, 320 nm and 340 nm respectively. Light emitting diodes having other central wavelengths may be used in the first radiation source, such central wavelengths being for instance about 405 nm, about 470 nm, about 515 nm, about 612 nm, about 782 nm and/or about 880 nm. Radiation having a wavelength of about 405 nm is usually perceived as violet and radiation having a wavelength of about 470 nm is usually perceived as blue. Light emitting diodes having a central wavelength of about 405 nm are therefore often referred to as violet light emitting diodes. Alternatively, violet light emitting diodes are sometimes referred to as near UV light emitting diodes. Light emitting diodes having a wavelength of 470 nm are often referred to as blue light emitting diodes. Taking this even further, radiation having a wavelength of 515 nm is usually perceived as cyan; radiation having a wavelength of 612 nm is usually perceived as orange and radiation having a wavelength of 782 nm is in the infrared range.

The radiation source may further comprise an adjustment mechanism configured to control the relative intensity of one or more of the plurality of light emitting diodes.

The measurement system may further comprise a controller that is configured to produce a plurality of control signals, each of which is received by a different one of the plurality of light emitting diodes, an output intensity or power of each light emitting diode being dependent on the control signal it receives from the controller.

The control signals therefore serve as drive signals for the light emitting diodes. In one embodiment the control signals may serve to switch a corresponding light emitting diode between an "on" state wherein, for example, the light emitting diode emits a radiation beam and an "off" state wherein, for example, the light emitting diode does not produce a radiation beam. Additionally or alternatively, the control signal may control an output intensity or power of each of the light emitting diodes through a range of intensities.

The radiation source may have a plurality of different operational modes, the spectral intensity distribution of the radiation beam being dependent on a selected operational mode of the radiation source. Such an arrangement may allow the measurement system to be used for a plurality of different purposes with the radiation beam having a different spectral intensity distribution for each purpose.

The controller may be operable to produce a different set of the plurality of control signals for each of the plurality of operational modes. That is to say that in each different operational mode, the controller may be operable to produce a plurality of control signals, each of which is received by a different one of the plurality of light emitting diodes. In each operational mode, a different set of the plurality of control signals may be produced. That is, for each pair of two operational modes at least one of the plurality of control signals that is received by one of the plurality of light emitting diodes may be different in the two operational modes. In this way, the spectral intensity distribution of the radiation beam is dependent on the selected operational mode of the controller.

The radiation source may have: a first operational mode and a second operational mode, and wherein in the first operational mode, the radiation beam comprises radiation in a first spectral range and wherein in the second operational mode the radiation beam comprises radiation in a second spectral range, the second spectral range being a subrange of the first spectral range. Such an arrangement provides both: a first operational mode with a larger spectral range which may provide enhanced performance of the measurement system; and a second operational mode with a smaller spectral range which may reduce the risk of pre-exposure of a resist covered substrate by the measurement system.

Additionally or alternatively, the radiation source may have: a first operational mode and a second operational mode, and wherein in the first operational mode the radiation beam has a first spectral intensity distribution and wherein in the second operational mode the radiation beam has a second spectral intensity distribution, the second spectral intensity distribution being reduced relative to the first spectral intensity distribution in a lower wavelength portion of the first spectral intensity distribution. Such an arrangement provides both: a first operational mode with a first spectral intensity distribution which may provide enhanced performance of the measurement system; and a second operational mode with a second spectral intensity distribution which may reduce the risk of pre-exposure of a resist covered substrate by the measurement system.

In the second operational mode one or more of the plurality of light emitting diodes with the shortest central wavelength has a reduced intensity relative to the first operational mode.

The measurement system may further comprise a spectrum detector that is configured to determine one or more characteristics of the wavelength spectrum of the radiation beam, the spectrum detector comprising at least one detecting element.

The at least one detecting element may comprise a photodiode.

The at least one detecting element may be provided by the detector. That is, the detector of the measurement system may be used to determine one or more characteristics of the wavelength spectrum of the radiation beam. For such an embodiment, measurement of one or more characteristics of the wavelength spectrum of the radiation beam is desirably made using a reference substrate that has a constant or known surface. During measurement of one or more characteristics of the wavelength spectrum of the radiation beam, the reference substrate may remain stationary.

Additionally or alternatively, the at least one detecting element may be separate from the detector. For such an embodiment, the spectrum detector may comprise a beam splitter arranged to divert a portion of the radiation beam to the at least one detecting element. It will be appreciated here that the term "beam splitter" is intended to cover any optics that are arranged to direct a portion of the radiation beam to the at least one detecting element. Another portion of the radiation beam may continue along a main optical path of the measurement system, which optical path may extend from the radiation source to the detector. The term "beam splitter" may therefore include, for example, a conventional beam splitter or a diffraction grating. In an embodiment, the term "beam splitter" may include an optical element that produces some stray radiation that would otherwise be lost from the optical path and which is collected, for example by additional optics, and directed to the at least one detecting element. The beam splitter may direct the portion of the radiation beam to the at least one detector either directly or indirectly via one or more additional optical elements. The beam splitter may be disposed at any suitable point in the measurement system, for example any position between the radiation source and the detector.

The spectrum detector may comprise separating optics arranged to separate a portion of the radiation beam which it receives into a plurality of constituent spectral components; and a plurality of detecting elements, each of which is operable to determine a power or intensity of a different one of the plurality of constituent spectral components.

The separating optics may comprise a dispersive optical element such as a prism. Each of the plurality of constituent spectral components may correspond to a component of the radiation beam which originated from a different one of the light emitting diodes.

The spectrum detector may be operable to output one or more signals indicative of a characteristic of the wavelength spectrum of the radiation beam. For example, each of the at least one detecting element may be operable to output a signal indicative of an intensity or power of the radiation beam that it receives from the separating optics. The intensity or power of the radiation beam that is received by the at least one detecting element contains information related to a characteristic of the wavelength spectrum of the radiation beam.

The or each of the one or more signals output by the spectrum detector may be received by the controller. The control signals may be generated by the controller in dependence on the one or more signals output by the spectrum detector.

In this way the measurement system comprises a feedback control loop that can be used to, e.g., stabilize the wavelength spectrum of the radiation beam.

The controller may be operable to control the output of the plurality of light emitting diodes such that each of the light emitting diodes is pulsed.

Each of the light emitting diodes may be pulsed in such a way that the pulses from the light emitting diodes are out of phase with pulses of the light emitting diodes that have different wavelength spectra. In this way, the output of the radiation source may produce a plurality of pulses, wherein the pulses cycle through a plurality of different wavelengths. This wavelength switching therefore provides a wavelength modulation of the radiation beam.

The detector may be able to temporally resolve each pulse. This may allow a plurality of height maps to be determined from a single measurement sequence (i.e. during a single scan of the substrate below the measurement system), each of the plurality of height maps being determined using a different wavelength (i.e. from a different light emitting diode).

The radiation source may further comprise combining optics arranged to receive radiation from each of the plurality of light emitting diodes and to combine it such that radiation from each of the plurality of light emitting diodes spatially overlaps to form a radiation beam.

The combining optics may comprise one or more dichroic mirrors arranged to receive two input radiation beams and to output at least one radiation beam comprising a portion of each of the two input radiation beams.

The combining optics may be operable to produce a combined radiation beam that provides a generally uniform spatial distribution of wavelength spectrum over the first patterning device. That is, each different spatial location on the first patterning device receives radiation with substantially the same wavelength spectrum. The wavelength spectrum may have any suitable form.

The radiation beam may illuminate the first patterning device generally uniformly.

The radiation beam may illuminate the first patterning device with a generally uniform angular distribution.

The measurement system may further comprise transmission optics arranged to transmit the radiation beam to the first patterning device. The transmission optics may comprise an array of optical fibers. It will be appreciated that the transmission optics may comprise one or more additional optical elements such as, for example, one or more mirrors and/or one or more lenses.

The radiation beam may comprise ultraviolet radiation in the range of 200 nm-425 nm. For example, the radiation beam may comprise ultraviolet radiation in the range of 225 nm-400 nm. For example, the radiation beam may comprise ultraviolet radiation in the range of 225 nm-350 nm. Additionally or alternatively, the radiation beam may comprise visible radiation and/or radiation within the range of 350 nm to 1000 nm.

The measurement system may further comprise a processor configured to determine a height of the substrate in dependence on the output signal.

According to a further aspect, there is provided a measurement apparatus comprising a plurality of measurement systems as described herein.

The plurality of measurement systems may share a common radiation source.

According to a further aspect, there is provided a radiation source for use in a measurement system as described herein, the radiation source comprising: a plurality of light emitting diodes, each of the plurality of light emitting diodes having a different wavelength spectrum; combining optics arranged to receive radiation from each of the plurality of light emitting diodes and to combine it such that radiation from each of the plurality of light emitting diodes spatially overlaps to form a radiation beam; and a controller that is operable to produce a plurality of control signals, each of which is received by a different one of the plurality of light emitting diodes, an output intensity or power of each light emitting diode being dependent on the control signal it receives from the controller.

Such an arrangement allows a broad band ultraviolet source to be formed from light emitting diodes. Advantageously, such an arrangement allows for a broad band ultraviolet source to be formed wherein the wavelength spectrum can be tailored to requirements, by suitable choice of control signals produced by the controller. Furthermore, it allows the spectrum of the radiation source to be adjusted by varying the relative intensities of the plurality of light emitting diodes.

The radiation source may comprise any of the features of the measurement system as appropriate.

The radiation source may further comprise a spectrum detector that is operable to determine one or more characteristics of the wavelength spectrum of the radiation beam.

The spectrum detector may comprise at least one detecting element.

The spectrum detector may comprise a beam splitter arranged to divert a portion of the radiation beam to the at least one detecting element.

The spectrum detector may comprise: separating optics arranged to separate a portion of the radiation beam which it receives into a plurality of constituent spectral components; and a plurality of detecting elements, each of which is operable to determine a power or intensity of a different one of the plurality of constituent spectral components.

The spectrum detector may be operable to output one or more signals indicative of a characteristic of the wavelength spectrum of the radiation beam.

The or each signal output by the spectrum detector may be received by the controller and the control signals may be generated by the controller in dependence thereon.

The controller may be operable to control the output of the plurality of light emitting diodes such that each of the light emitting diodes is pulsed.

The light emitting diodes may be pulsed in such a way that the pulses from each of one or more of the light emitting diodes are out of phase with one or more other light emitting diodes.

The radiation source may have a plurality of different operational modes, the spectral intensity distribution of the radiation beam being dependent on a selected operational mode of the radiation source. Such an arrangement may allow the radiation source to be used for a plurality of different purposes with the radiation beam having a different spectral intensity distribution for each purpose.

The controller may be operable to produce a different set of the plurality of control signals for each of the plurality of operational modes. That is to say that in each different operational mode, the controller may be operable to produce a plurality of control signals, each of which is received by a different one of the plurality of light emitting diodes. In each operational mode, a different set of the plurality of control signals may be produced. That is, for each pair of two operational modes at least one of the plurality of control signals that is received by one of the plurality of light emitting diodes is different in the two operational modes. In this way, the spectral intensity distribution of the radiation beam is dependent on the selected operational mode of the controller.

The radiation source may have: a first operational mode and a second operational mode, and wherein in the first operational mode, the radiation beam comprises radiation in a first spectral range and wherein in the second operational mode the radiation beam comprises radiation in a second spectral range, the second spectral range being a subrange of the first spectral range. Such an arrangement provides both: a first operational mode with a larger spectral range which may provide enhanced performance of the measurement system; and a second operational mode with a smaller spectral range which may reduce the risk of pre-exposure of a resist covered substrate by the measurement system.

The radiation source may have: a first operational mode and a second operational mode, and wherein in the first operational mode the radiation beam has a first spectral intensity distribution and wherein in the second operational mode the radiation beam has a second spectral intensity distribution, the second spectral intensity distribution being reduced relative to the first spectral intensity distribution in a lower wavelength portion of the first spectral intensity distribution. Such an arrangement provides both: a first operational mode with a first spectral intensity distribution which may provide enhanced performance of the measurement system; and a second operational mode with a second spectral intensity distribution which may reduce the risk of pre-exposure of a resist covered substrate by the measurement system.

In the second operational mode one or more of the plurality of light emitting diodes with the shortest central wavelength may have a reduced intensity relative to the first operational mode.

According to an aspect, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a measurement system as described herein or a measurement apparatus as described herein.

Different aspects and features may be combined together. Features of a given aspect may be combined with one or more other aspects or features.

BRIEF DESCRIPTION OF THE DRAWINGS

Embodiments will now be described, by way of example only, with reference to the accompanying schematic drawings, in which.

DETAILED DESCRIPTION

Figure 1B:
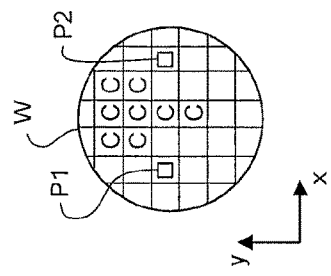
FIG. 1B shows a plan view of a substrate W which may represent either of the two substrates of FIG. 1A.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

A support structure holds the patterning device. It holds the patterning device in a way that depends on the orientation of the patterning device, the design of the lithographic apparatus, and other conditions, such as, for example, whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The term "illumination system" used herein may encompass various types of optical components, including refractive, reflective, and catadioptric optical components for directing, shaping, or controlling the beam of radiation, and such components may also be referred to below, collectively or singularly, as a "lens".

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

Figure 1C:
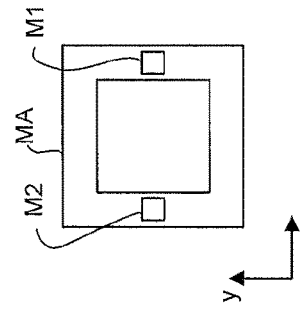
FIG. 1C shows a plan view of a patterning device, which may be used by the lithographic system of FIG. 1A.
Figure 1A:
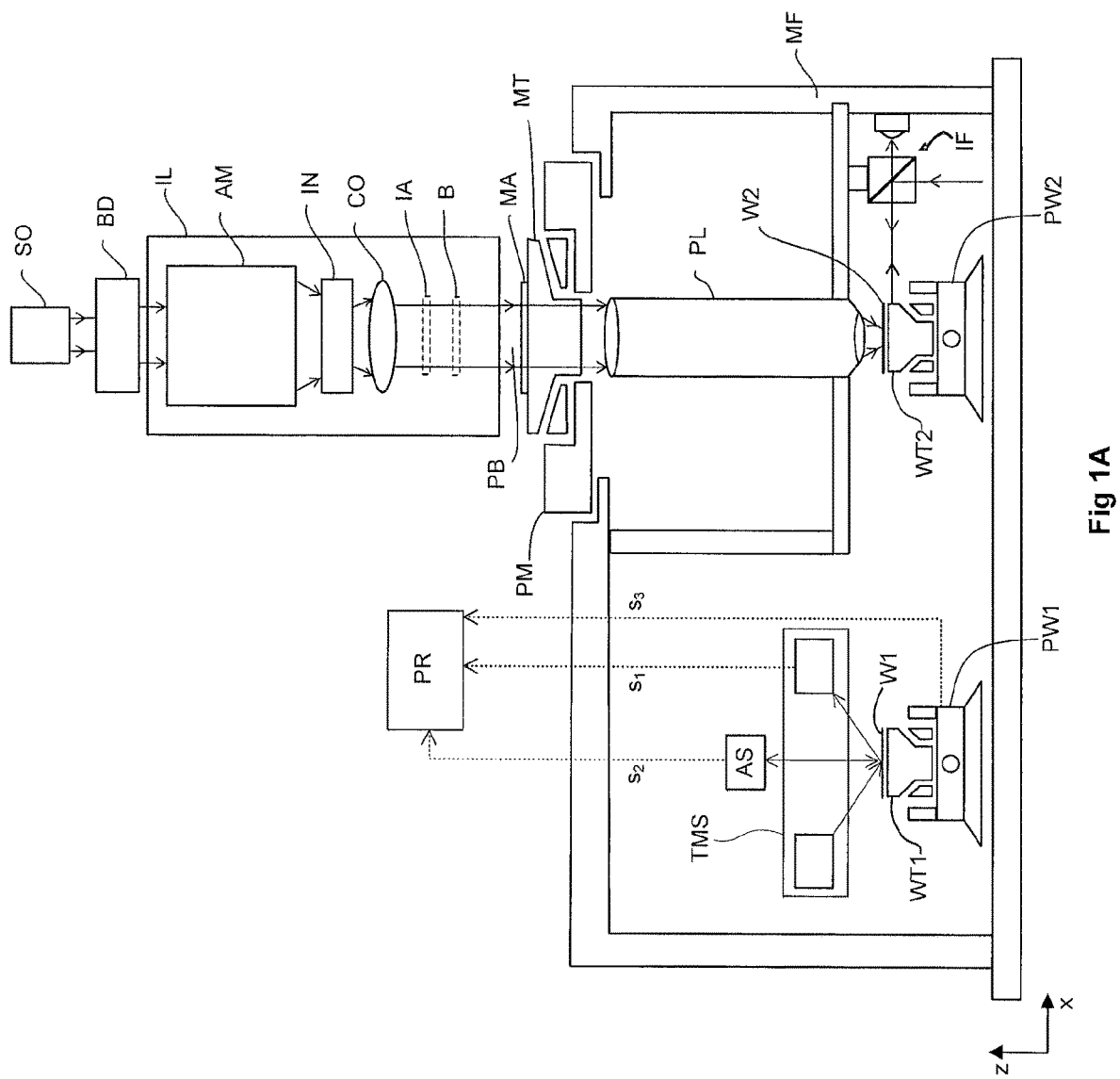
FIG. 1A schematically depicts a lithographic system comprising a topography measurement system according to an embodiment.

FIG. 1A schematically depicts a lithographic apparatus according to a particular embodiment. The apparatus comprises:
- an illumination system (illuminator) IL configured to condition a beam PB of radiation (e.g. UV radiation or DUV radiation);
- a frame MF;
- a support structure (e.g. a mask table) MT to support a patterning device (e.g. a mask) MA;
- two substrate tables (e.g. a wafer table) WT1, WT2, each configured to hold a substrate (e.g. a resist coated wafer) W1, W2 respectively; and
- a projection system (e.g. a refractive projection lens) PL configured to image a pattern imparted to the radiation beam PB by patterning device MA onto a target portion C (e.g. comprising one or more dies) of a substrate W held by one of the two substrate tables WT1, WT2.

The frame MF is a vibration isolated frame that is substantially isolated from external influences such as vibrations. For example, the frame MF may be supported by a base frame (not shown) on the ground via one or more acoustically damping mounts (not shown), so as to isolate the frame MF from vibrations of the base frame. The one or more acoustically damping mounts may be actively controlled to isolate vibrations which are introduced by the base frame and/or by the isolated frame MF itself.

In the dual stage lithographic apparatus depicted in FIG. 1A an alignment system AS and a topography measurement system TMS are provided on the left-hand side and the projection system PL is provided on the right-hand side. The projection system PL, alignment system AS and topography measurement system TMS are connected to the isolated frame MF.

The support structure MT is movably mounted to the frame MF via a first positioning device PM. The first positioning device PM may be used to move the patterning device MA, and to accurately position it, relative to the frame MF (and the projection system PL which is connected to the frame MF).

The substrate tables WT1, WT2 are movably mounted to the frame MF via first and second substrate positioning devices PW1, PW2 respectively. The first and second substrate positioning devices PW1, PW2 may be used to move substrates W1, W2 held by substrate tables WT1, WT2 respectively, and to accurately position the substrates W1, W2, relative to the frame MF (and the projection system PL, alignment system AS and topography measurement system TMS which are connected to the frame MF). The support structure MT and the substrate tables WT1, WT2 may be referred to collectively as object tables. The first and second substrate positioning devices PW1, PW2 may each be considered to be a scanning mechanism operable to move a substrate table WT1, WT2 along a scanning path relative to the radiation beam such that the radiation beam scans across a target portion C of the substrate W. In an embodiment, one of the tables WT1, WT2 may not hold a substrate and may instead be used for, e.g., measurement, cleaning, etc. in parallel with, e.g., exposure or unloading of the substrate on the other table WT1, WT2.

The lithographic apparatus shown in FIG. 1A is therefore of a type having two substrate tables WT1, WT2, which may be referred to as a dual stage apparatus. In such "multiple stage" machines the two substrate tables WT1, WT2 are used in parallel, with preparatory steps being carried out on one of the substrates tables while the other substrate table is being used for exposure.

In FIG. 1A, the substrate table WT1 is disposed on the left and the substrate table WT2 is disposed on the right. In this configuration, substrate table WT1 can be used to carry out various preparatory steps in relation to the substrate W1 held thereby using alignment system AS and topography measurement system TMS (as will be described more fully below) prior to exposure of that substrate W1. Simultaneously, the substrate table WT2 can be used for exposure of another substrate W2 held by substrate table WT2. Once the substrate W2 held by substrate table WT2 has been exposed and the preparatory steps in relation to the substrate W1 held by substrate table WT1 have been carried out, the two substrate tables WT1, WT2 swap places. Subsequently, the substrate W1 held by substrate table WT1 is exposed to radiation and the substrate W2 held by substrate table WT2 that has previously been exposed to radiation is replaced with a new substrate and various preparatory steps are performed in relation to the new substrate.

Therefore each of the two substrate tables WT1, WT2 can be disposed either on the left or the right of FIG. 1A. Unless stated otherwise in the following, substrate table WT1 will generally refer to the substrate table which is at that time disposed on the left and substrate table WT2 will generally refer to the substrate table which is at that time disposed on the right.

FIG. 1B shows a plan view of a substrate W which may represent either of the two substrates W1, W2 of FIG. 1A. In the following, unless otherwise stated, substrates on the left and right of the lithographic apparatus will be referred to as substrate W. FIG. 1C shows a plan view of the patterning device MA, which is provided with patterning device alignment marks (schematically depicted as boxes M1, M2).

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The illuminator IL may be referred to as a radiation system. Alternatively, the source SO and the illuminator IL, together with the beam delivery system BD if required, may be collectively referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may also be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjustor AM configured to adjust the intensity distribution of the beam. Generally, at least the outer and/or inner radial extent (commonly referred to as σ-outer and σ-inner, respectively) of the intensity distribution in a pupil plane of the illuminator can be adjusted. The illuminator IL may also be operable to vary the angular distribution of the beam in a pupil plane of the illuminator. For example, the illuminator IL may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multipole distribution such as, for example, a dipole, quadrupole or hexapole distribution, as is known in the art. A desired illumination mode may be obtained by inserting an optic which provides that illumination mode into the illuminator IL.

The illuminator IL may be operable alter the polarization of the beam and may be operable to adjust the polarization using adjusting means AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator IL may be arranged to linearly polarize the radiation beam. The polarization direction of the radiation beam may vary across a pupil plane of the illuminator IL, i.e. the polarization direction of radiation may be different in different regions in the pupil plane of the illuminator IL. The polarization state of the radiation may be chosen in dependence on the illumination mode.

In addition, the illuminator IL generally comprises various other components, such as an integrator IN and a condenser CO. The illuminator IL provides a conditioned beam of radiation PB, having a desired uniformity and intensity distribution in its cross section.

The shape and (spatial) intensity distribution of the conditioned beam of radiation PB are defined by optics of the illuminator IL. In a scan mode, the conditioned radiation beam PB may be such that it forms a generally rectangular band of radiation on the patterning device MA. The band of radiation may be referred to as an exposure slit (or slit). The slit may have a longer dimension (which may be referred to as its length) and a shorter dimension (which may be referred to as its width). The width of the slit may correspond to a scanning direction (y direction in FIG. 1) and the length of the slit may correspond to a non-scanning direction (x direction in FIG. 1). In a scan mode, the length of the slit limits the extent in the non-scanning direction of the target portion C that can be exposed in a single dynamic exposure. In contrast, the extent in the scanning direction of the target portion C that can be exposed in a single dynamic exposure is determined by the length of the scanning motion.

The terms "slit", "exposure slit" or "band or radiation" may be used interchangeably to refer to the band of radiation that is produced by the illuminator IL in a plane perpendicular to an optical axis of the lithographic apparatus. This plane may be at, or close to, either the patterning device MA or the substrate W. The terms "slit profile", "profile of the radiation beam", "intensity profile" and "profile" may be used interchangeably to refer to the shape of the (spatial) intensity distribution of the slit, especially in the scanning direction.

In an embodiment, the illuminator IL comprises two masking blades (shown schematically in FIG. 1A as B). Each of the two masking blades is generally parallel to the length of the slit, the two masking blades being disposed on opposite sides of the slit. Each masking blade is independently movable between a retracted position wherein it is not disposed in the path of the radiation beam PB and an inserted position wherein it blocks the radiation beam PB. The masking blades are disposed in a field plane of the illuminator IL. Therefore, by moving the masking blades into the path of the radiation beam, the profile of the radiation beam PB can be sharply truncated thus limiting the extent of the field of radiation beam PB in the scanning direction. The masking blades can be used to control which parts of an exposure region receive radiation.

The patterning device MA is also disposed in a field plane of the lithographic apparatus. In one embodiment, the masking blades may be disposed adjacent to the patterning device MA such that both the masking blades and the patterning device MA lie in substantially the same plane. Alternatively, the masking blades may be separated from the patterning device MA such that they each lie in a different field plane of the lithographic apparatus and suitable focusing optics (not shown) may be provided between the masking blades and the patterning device MA.

The illuminator IL comprises an intensity adjuster IA (shown schematically in FIG. 1A). The intensity adjuster IA is operable to attenuate the radiation beam on opposing sides of the radiation beam, as now described. The intensity adjuster IA comprises a plurality of movable fingers arranged in pairs, each pair comprising one finger on each side of the slit (i.e. each pair of fingers is separated in the y-direction). The pairs of fingers are arranged along the length of the slit (i.e. extending in the x-direction). Each movable finger is independently movable in the scanning direction (y-direction). That is, the fingers are moveable in a direction perpendicular to the length of the slit. In use, each movable finger is independently movable in the scanning direction. For example, each movable finger may be movable between at least a retracted position wherein it is not disposed in the path of the radiation beam and an inserted position wherein it partially blocks the radiation beam. By moving the fingers, the shape and/or the intensity distribution of the slit can be adjusted.

The field may be in the penumbra of the fingers such that the fingers do not sharply cut off the radiation beam PB. The pairs of fingers may be used to apply a different level of attenuation of the radiation beam PB along the length of the slit. The fingers may, for example, be used to ensure that the integral of the intensity profile of the radiation beam PB across the width of the slit is substantially constant along the length of the slit.

The radiation beam PB exiting the illuminator IL is incident on the patterning device (e.g. mask) MA, which is held on the support structure MT. Having traversed the patterning device MA, the beam PB passes through the projection system PL, which focuses the beam onto a target portion C of the substrate W. With the aid of the second substrate positioning device PW2 and position sensor IF (e.g. an interferometric device), the substrate table WT2 can be moved accurately relative to the frame MF, e.g. so as to position different target portions C in the path of the beam PB. Similarly, the first positioning device PM and another position sensor (which is not explicitly depicted in FIG. 1A) can be used to accurately position the patterning device MA with respect to the frame MF, e.g. after mechanical retrieval from a mask library, or during a scan. In general, movement of the object tables MT and WT1, WT2 will be realized with the aid of a long-stroke module (coarse positioning) and a short-stroke module (fine positioning), which form part of the positioning devices PM, PW1 and PW2. Patterning device MA and substrate W may be aligned using patterning device alignment marks M1, M2 and substrate alignment marks P1, P2.

The projection system PL may apply a reduction factor to the radiation beam PB, forming an image with features that are smaller than corresponding features on the patterning device MA. For example, a reduction factor of 4 may be applied.

In the scan mode, the first positioning device PM is operable to move the support structure MT, relative to the beam of radiation PB that has been conditioned by the illuminator IL, along a scanning path. In an embodiment, the support structure MT is moved linearly in a scanning direction at a constant scan velocity $v_{MT}$. As described above, the slit is orientated such that its width extends in the scanning direction (which coincides with the y-direction of FIG. 1). At any instance each point on the patterning device MA that is illuminated by the slit will be imaged by the projection system PL onto a single conjugate point in the plane of the substrate W. As the support structure MT moves in the scanning direction, the pattern on the patterning device MA moves across the width of the slit with the same velocity as the support structure MT. In particular, each point on the patterning device MA moves across the width of the slit in the scanning direction at velocity $v_{MT}$. As a result of the motion of this support structure MT, the conjugate point in the plane of the substrate W corresponding to each point on the patterning device MA will move relative to the slit in the plane of the substrate table WT2.

In order to form an image of the patterning device MA on the substrate W, the substrate table WT2 is moved such that the conjugate point in the plane of the substrate W of each point on the patterning device MA remains stationary with respect to the substrate W. The velocity (both magnitude and direction) of the substrate table WT2 relative to the projection system PL is determined by the demagnification and image reversal characteristics of the projection system PL (in the scanning direction). In particular, if the characteristics of the projection system PL are such that the image of the patterning device MA that is formed in the plane of the substrate W is inverted in the scanning direction then the substrate table WT2 should be moved in the opposite direction to the support structure MT. That is, the motion of the substrate table WT2 should be anti-parallel to the motion of the support structure MT. Further, if the projection system PL applies a reduction factor $\alpha$ to the radiation beam PB then the distance travelled by each conjugate point in a given time period will be less than that travelled by the corresponding point on the patterning device by a factor of $\alpha$. Therefore the magnitude of the velocity $|v_{WT}|$ of the substrate table WT2 should be $|v_{MT}\nabla\alpha$.

During exposure of a target portion C, the masking blades of the illuminator IL can be used to control the width of the slit of radiation beam PB, which in turn limits the extent of the exposure regions in the planes of the patterning device MA and the substrate W respectively. That is the masking blades of the illuminator serve as a field stop for the lithographic apparatus.

Using the scan mode, the lithographic apparatus is operable to expose a target portion C of the substrate W with substantially fixed area to radiation. For example, the target portion C may comprise part of, one or several dies. A single substrate may be exposed to radiation in a plurality of steps, each step involving the exposure of a target portion C followed by a movement of the substrate W. After exposure of a first target portion C, the lithographic apparatus may be operable to move the substrate W relative to the projection system PL so that another target portion C can be exposed to radiation. For example, between exposures of two different target portions C on the substrate W, the substrate table WT2 may be operable to move the substrate W so as to position the next target portion so that it is ready to be scanned through the exposure region.

Alternatively, the depicted apparatus can be used in another mode, wherein the support structure MT is kept essentially stationary holding a programmable patterning device, and the substrate table WT2 is moved or scanned while a pattern imparted to the beam PB is projected onto a target portion C. In this mode, generally a pulsed radiation source is employed and the programmable second patterning device is updated as required after each movement of the substrate table WT2 or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The alignment system AS measures the positions of alignment marks provided on the substrate W (schematically depicted by boxes P1, P2 in FIG. 1B) which is held on left-hand substrate table WT1. In addition, the topography measurement system TMS is used to measure the topography of a surface of the substrate W held on left-hand substrate table WT1, as described further below. The first substrate positioning device PW1 and a position sensor (which is not explicitly depicted in FIG. 1A) can be used to accurately position the substrate table WT1 relative to the frame MF (and the alignment system AS and the topography measurement system TMS connected thereto). Additionally or alternatively, topography measurement system TMS may be provided to the right-hand side adjacent the bottom of the projection system PL.

The topography of the surface of each substrate W may be determined using the topography measurement system TMS, as now described.

Figure 2:
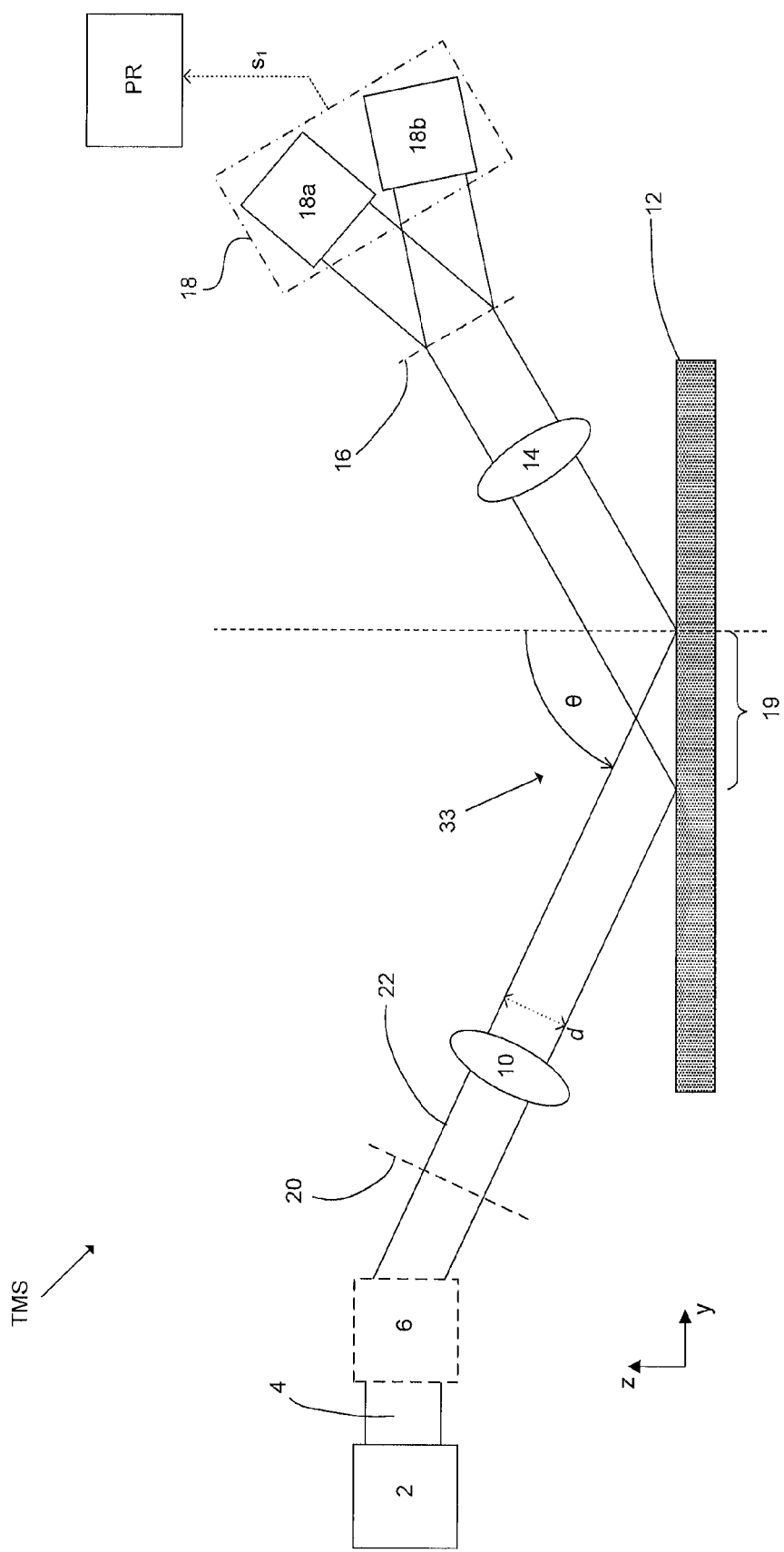
FIG. 2 schematically depicts a topography measurement system in more detail.

FIG. 2 is a schematic diagram of a topography measurement system TMS according to an embodiment. A radiation source 2 is configured to generate a radiation beam 4. Optics 6 may be provided to direct and/or focus the radiation beam 4. The radiation beam 4 is incident on a first patterning device 20. The radiation beam 4 is patterned with an image of the first patterning device 20 on passing through the first patterning device 20. The patterned radiation beam may be referred to as a measurement beam 22 (or alternatively may be referred to simply as a radiation beam).

The measurement beam 22 passes through optics 10 that are configured to form an image of the first patterning device 20 at a target location 19 on a substrate 12. The measurement beam 22 is incident upon the substrate 12 at an angle of incidence θ. The first grating image is formed at the location indicated by arrow 33.

The measurement beam 22 is redirected (e.g., reflected, diffracted, etc.) from the substrate 12 and passes through detection optics 14. The detection optics 14 is configured to receive the redirected measurement beam and form an image of the first grating image. This image of the first grating image is formed at a grating 16. A detector 18 is configured to receive radiation transmitted through the grating 16.

The detector 18 comprises two detecting elements 18a, 18b. The grating 16 splits the radiation received from the detection optics 14 such that a portion of the radiation is directed to each of the detecting elements 18a, 18b. Each of the detecting elements 18a, 18b detects the intensity of radiation incident upon it. The detector 18 produces an output signal $s_1$ that is indicative of the intensity of the radiation incident upon the two detecting elements 18a, 18b. In particular, the output signal $s_1$ may be indicative of a difference in the intensities of the radiation incident upon the two detecting elements 18a, 18b.

The second grating 16 is provided with a grating structure. The grating structure may, for example, comprise a periodically repeating unit cell, i.e. for a one-dimensional case the grating structure may comprise a regular array of lines. The second grating 16 is a transmissive grating. However, it will be appreciated that in an alternative embodiment the second grating 16 may comprise a reflective grating.

The detecting elements 18a, 18b may, for example, each be a photodiode. An advantage of using a photodiode is that photodiodes have a fast response time and have a relatively low cost. Alternatively, the detector may comprise an imaging detector such as, for example, a charge coupled device (CCD), an active pixel sensor (APS), or any other suitable form of imaging detector. For such embodiments, in which an imaging detector is used, the output from the imaging detector may be converted into a value indicative of intensity of incident radiation. An imaging detector may have a slower response time than photodiodes, possibly reducing the speed at which the topography of a substrate 12 can be measured.

Before the topography of the substrate 12 is determined, one or more preliminary measurements may be made using the topography measurement system TMS. The topography measurement system TMS can be used to measure a height of the substrate 12 at a plurality of points on the substrate 12 so as to determine a height map of the substrate 12, as will be described in further detail below. The topography measurement system TMS may have a limited measurement range, for example of the order of ±2.5 μm. Before the topography of the substrate 12 is determined (i.e. before a height map is determined), the topography measurement system TMS may be used to determine a position of the substrate table WT1 (in the z direction) that will ensure that an upper surface of the substrate 12 is within the measurement range of the topography measurement system TMS. This may be referred to as "wafer capture". Wafer capture may be performed at a fixed position on the substrate 12 in the x-y plane, while the substrate table WT1 (and therefore substrate 12) is moved in the z-direction. During wafer capture, radiation from the radiation source 2 (the measurement beam 22) is incident on the substrate 12.

Additionally or alternatively, before the topography of the substrate 12 is determined (i.e. before a height map is determined), the topography measurement system TMS may be used to determine one or more other properties of the substrate 12. For example, the topography measurement system TMS may be used to determine the position of the substrate 12 in the x-y plane, for example by determining an edge of the (generally circular) substrate 12.

Once such one or more preliminary measurements have been made, in order to determine the topography of the substrate 12, the first substrate positioning device PW1 is used to move the substrate 12 such that the target location 19 on the substrate 12 that receives radiation beam 22 changes. The first substrate positioning device PW1 may be operable to move the substrate 12 relative to the topography measurement system TMS in a manner similar to the motion of the substrate relative to the projection system PL that is performed by the second substrate positioning device PW2.

As the substrate 12 is linearly moved with respect to the image 33 of the patterning device 20, the detected signal at the grating 16 can be considered to be directly proportional to a convolution of the topography of the substrate 12 with the image 33 of the patterning device 20.

As the substrate 12 is scanned underneath the patterning device image 33, changes in the height of the substrate cause changes of the phase distribution of radiation at the grating 16. The grating 16 converts these changes of the phase distribution into changes of radiation intensity at the detector 18. Changes in the height of substrate 12 cause the image of the patterning device 20 at the grating 16 to move (relative to the grating 16). This movement of the image at the grating 16 is converted by grating 16 into an intensity unbalance detected by the two detecting elements 18a, 18b. As a result, the signal $s_1$ output from the detector 18 is indicative of the height of the substrate 12.

The output signal $s_1$ is received by a processor PR. The signal output from the detector 18 may be analyzed by processor PR to determine the height of the substrate 12. The processor PR may be used to generate a map of the topography of the substrate 12. The processor PR may comprise a memory and may be operable to store information relating to the topography of the entire substrate W. The topography of the surface of a substrate W may be referred to as a height map.

During exposure of a substrate W (on the right-hand side of FIG. 1A) it is desirable to keep the substrate W in a focal plane of the projection system PL. In order to achieve this, the substrate table WT2 may be moved in the z direction, the movement of the substrate table WT2 being determined in dependence on the topography of the surface of a substrate W (as previously determined by the topography measurement system TMS).

The processor PR may be considered to be a digital signal processing system. The processor PR may comprise, e.g., one or more microprocessors or one or more Field-Programmable Gate Arrays (FPGA), etc. The processor PR may be a system dedicated to the topography measurement system TMS. Alternatively, the processor PR may be a more general system that also processes digital signals from other functional modules in the lithographic apparatus of FIG. 1A. For example, as shown in FIG. 1A, the processor PR may also process a signal $s_2$ from the alignment system AS.

In addition to data from the alignment system AS and the topography measurement system TMS, the processor PR also receives substrate table WT1 position information (see signal $s_3$ in FIG. 1A) from first substrate positioning device PW1. Since the substrate is fixed to (typically via a clamp) the substrate table WT1, position information relating to the substrate table WT1 may be taken as being position information relating to the substrate W.

A plurality of topography measurement systems TMS may be provided. That is, a plurality of radiation beams 4 may be produced, each being directed and/or focused by different optics 6 onto a different patterning device 20 so as to produce a plurality of measurement radiation beams 22. All of the first patterning devices 20 may be provided on a single reticle. Each such measurement radiation beam 22 may then pass through different illumination optics 10 and illuminate multiple target locations on the substrate 12. For such embodiments that use a plurality of topography measurement systems TMS, a plurality of radiation sources may be used to produce the plurality of radiation beams 4, each radiation source being operable to produce a radiation beam 4 for a different topography measurement system TMS. Alternatively, a single radiation source may be used, in combination with optics arranged to distribute a portion of the radiation generated by the radiation source to each one of the topography measurement systems TMS.

In this way, a plurality of target locations (or "spots") of the substrate W may be illuminated by the radiation beam. For example, of the order of ten to one hundred spots on the substrate W may be illuminated. This plurality of spots may extend in a non-scanning direction of the substrate W and may, for example span a single target portion C of the substrate (see FIG. 1B).

Multiple detectors 18 and multiple gratings 16 may be used to detect the measurement radiation beams and provide output signals $s_1$. The processor PR may receive the output signals $s_1$ and convert these into substrate height measurements. The processor PR may generate a height map for the substrate 12 using the measurements. Using multiple measurement radiation beams in this manner is advantageous because it allows a height map to be generated for the substrate 12 more quickly (it allows the substrate to be scanned in fewer strokes). The plurality of topography measurement systems TMS may be referred to as a topography measurement apparatus.

In one embodiment, a single radiation source, which may be provided separate from the frame MF, illuminates an array of optical fibers. Each of the optical fibers transmits a portion of the radiation output by the radiation source to one or more of the optics 6. In one embodiment, a plurality of such optical fibers is provided for each optics 6. Desirably, the optical fibers are disposed out of a focal plane of the illumination optics 10 (i.e. the optical fibers are not disposed in the same plane as the first grating 20) so that they do not affect the topography measurements.

The radiation beam 4 may illuminate the patterning device 20 generally uniformly and with a generally uniform angular distribution. In order to achieve this, the radiation source 2, which may be provided separate from the frame MF, may illuminate an array of optical fibers generally uniformly and with a generally uniform angular distribution.

In general, a substrate will be provided with a plurality of patterned layers in order, for example, to create a multi-layer IC. Each layer is formed by projecting a patterned layer to expose resist on the substrate and then processing the substrate. The processing may for example comprise etching the resist, depositing material into recesses formed by the etching, and then polishing the substrate. This forms a layer of patterned material on the substrate. The thickness of the layer will depend upon the processing that is performed, and will vary from layer to layer. A set of patterned layers on a substrate may be referred to as a stack. A lithographic apparatus should be capable of projecting patterns onto substrates with stacks of widely varying compositions. The topography measurement system TMS is capable of measuring substrate topography for expected stack compositions. For clarity, the substrate topography measurement system TMS may also be referred to as a level sensing system or as a level sensor. As known, a level sensor is used to make a height map of the substrate.

Any suitable angle of incidence θ may be chosen. Penetration of the measurement beam 22 into the substrate stack may cause interference effects which may introduce errors into height measurements. The extent of the penetration that will occur depends on the wavelength, polarization and the angle of incidence of the measurement beam. In general, the penetration depth of the measurement beam 22 decreases for decreasing wavelengths and decreases for increasing angles of incidence θ.

Increasing the angle of incidence decreases the penetration depth of the measurement beam 22 into the substrate 12 sub-structure. This means that fewer stack reflections occur and their associated interference effects in the reflected measurement beam are avoided or reduced. By avoiding or reducing the interference effects caused by different stack reflections, process dependent errors of the topography measurement are reduced and the accuracy of the topography measurement system is increased. However, increasing the angle of incidence θ also causes the size of the first grating image 33 to increase, which may reduce the resolution of the topography measurement system TMS. The size of the first grating image 33 formed on the substrate 12 may, for example, be given by the ratio of the diameter d of the radiation beam 22 to the cosine of the angle of incidence θ, i.e. $d/\cos(\theta)$. In some embodiments, the angle of incidence θ used in the topography measurement system TMS may lie in the range of 70° to 85°. It should be noted that, for ease of illustration, FIG. 2, which is merely a schematic illustration, does not depict an angle of incidence θ in the range of 70° to 85° but instead depicts a smaller angle.

Broadband radiation may be utilized to increase the accuracy of topography measurements, since the interference effects caused by reflections from different stack layers may approximately average out across a range of radiation wavelengths. Furthermore, ultraviolet radiation may provide better performance of the topography measurement system TMS (i.e. a smaller offset between the measured height and real height of the substrate 12) compared to the use of visible and/or infrared radiation. Therefore, it may be desirable to provide a radiation source 2 which provides broadband ultraviolet radiation, for example in the range 200-425 nm, for the topography measurement system TMS.

It is also desirable that the intensity of such a radiation source be sufficiently low that it does not expose resist on the substrate. In order to achieve this, it may be desirable to provide a radiation source 2 whose output can be easily controlled.

Embodiments relate to topography measurement systems TMS wherein the radiation source 2 comprises a light emitting diode operable to output ultraviolet radiation. In particular, they relate to topography measurement systems TMS wherein the radiation source 2 comprises a plurality of light emitting diodes, at least two of the plurality of light emitting diodes having different wavelength spectra.

Such an arrangement allows a broad band ultraviolet source to be formed from light emitting diodes. Advantageously, such an arrangement allows for a broad band ultraviolet source 2 to be formed wherein the wavelength spectrum can be controlled and therefore can be tailored to requirements. For example, the spectrum of the radiation source 2 may be adjusted by varying the relative intensities of the plurality of light emitting diodes.

Ultraviolet light emitting diodes are a relatively new solid state technology, and significant progress has been made in this field in recent years, in particular in relation to their output power (i.e. the light emitting diode external efficiency). Ultraviolet light emitting diodes are now available with customizable wavelength, which are capable of being instantly switched on or off, and which are shock resistant.

Figure 3:
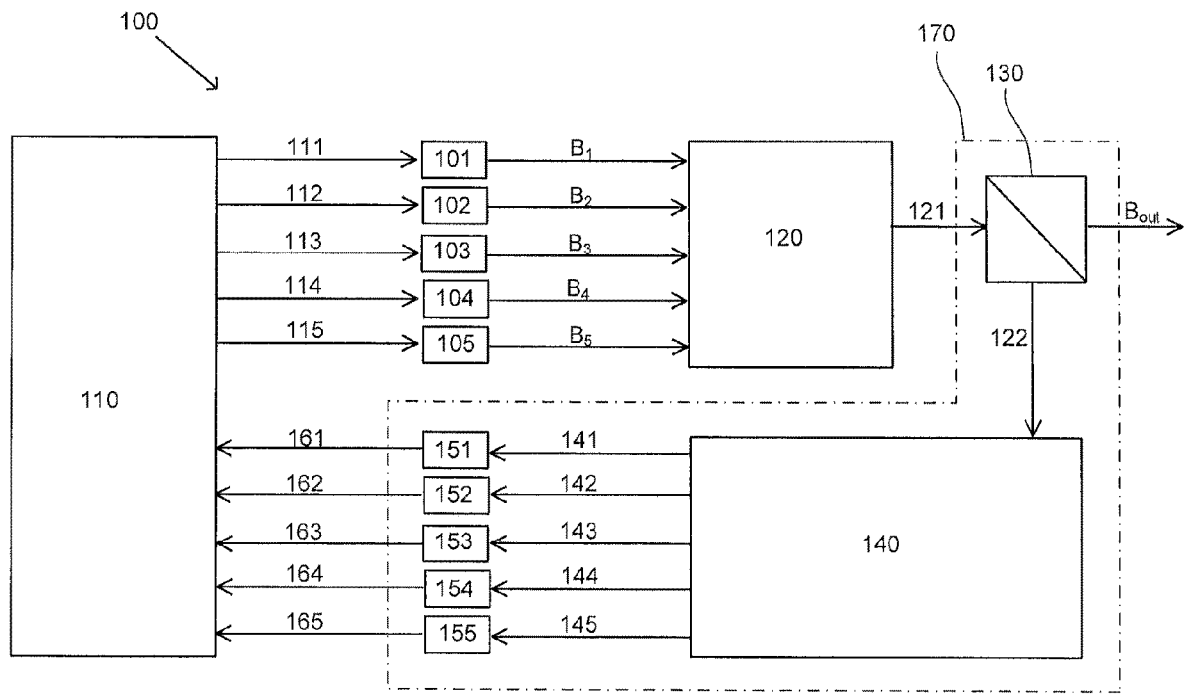
FIG. 3 schematically illustrates a radiation source according to an embodiment that may form part of the topography measurement system shown in FIG. 2.

FIG. 3 is a schematic diagram of a radiation source 100 for a topography measurement system TMS according to an embodiment. For example, radiation source 100 may correspond to the radiation source 2 shown in FIG. 2.

The radiation source 100 comprises a plurality of light emitting diodes 101-105. Each of the light emitting diodes 101-105 is operable to produce a radiation beam $B_1$-$B_5$ comprising ultraviolet radiation. Each of the plurality of light emitting diodes 101-105 has a different wavelength spectrum. That is, a central wavelength of each of the radiation beams $B_1$-$B_5$ is different. In one specific embodiment, radiation beam $B_1$ has a wavelength of 265 nm, radiation beam $B_2$ has a wavelength of 280 nm, radiation beam $B_3$ has a wavelength of 300 nm, radiation beam $B_4$ has a wavelength of 320 nm, and radiation beam $B_5$ has a wavelength of 340 nm. Although the specific embodiment shown in FIG. 3 comprises five light emitting diodes, it will be appreciated that other embodiments may comprise fewer than or more than five light emitting diodes. Optionally light emitting diodes having a wavelength of 515 nm, 612 nm 782 nm and/or 880 nm may be used.

Furthermore, although in the specific embodiment shown in FIG. 3 each of the plurality of light emitting diodes 101-105 has a different wavelength spectrum, in some alternative embodiments at least some of the light emitting diodes may have identical or similar wavelength spectra. For example, in an alternative embodiment, each of the light emitting diodes 101-105 shown in FIG. 3 may be replaced with a pair of identical light emitting diodes (i.e. such that there are ten light emitting diodes). This may allow the intensity of the radiation source 100 to be increased. Additionally or alternatively, it may allow each of the light emitting diodes to be operated at lower operating currents, which may increase the lifetime of each light emitting diode in the radiation source 100.

The radiation source 100 further comprises a controller 110. Controller 110 is operable to produce a plurality of control signals 111-115, each of which is received by a different one of the plurality of light emitting diodes 101-105 respectively. The control signals 111-115 serve as drive signals for the light emitting diodes 101-105. The intensity or power of each of the radiation beams $B_1$-$B_5$ output by the light emitting diodes 101-105 is dependent on a respective control signal 111-115 produced by the controller 110.

In one embodiment the control signal 111-115 may serve to switch a corresponding light emitting diode 101-105 between an "on" state wherein, for example, the light emitting diode 101-105 emits a radiation beam $B_1$-$B_5$ and an "off" state wherein, for example, the light emitting diode 101-105 does not produce a radiation beam.

Additionally or alternatively, the control signal 111-115 may control an output intensity or power of each of the light emitting diodes 101-105 through a range of values. For example, by suitable choice of control signal 111-115, the controller 110 may be operable to control an output intensity or power of each of the radiation beams $B_1$-$B_5$ through a continuous range of values. Such continuous control over the output intensity or power of the light emitting diodes 101-105 may be achieved in a number of different ways, as will be appreciated by the skilled person.

For example, a current passed through each of the light emitting diodes 101-105 may be varied independence on the control signal 111-115.

Alternatively, each of the light emitting diodes 101-105 may be pulsed such that its output radiation beam $B_1$-$B_5$ comprises a plurality of pulses. For such embodiments, control over an (average) output intensity or power of each of the radiation beams $B_1$-$B_5$ may be achieved by pulse width modulation. For example each of the light emitting diodes 101-105 may be pulsed at a frequency which is sufficiently high that each point on the substrate 12 receives a large number of pulses (for example more than 100 or more than 1000). By varying the duty cycle at which each of the light emitting diodes 101-105 is pulsed the intensity (or power) of each of the light emitting diodes 101-105 when averaged or integrated over a suitable time period can be controlled.

Alternatively, each of the light emitting diodes 101-105 may comprise a variable attenuator. For such embodiments the control signal 101-115 output by the controller 110 may determine the level of attenuation of each of the light emitting diodes 101-105.

Alternatively, for embodiments comprising a plurality of identical light emitting diodes for each separate wavelength component, the output for each separate wavelength component may be controlled by varying the number of light emitting diodes of that wavelength that are operating.

The controller 110 may comprise, for example, one or more microprocessors or one or more Field-Programmable Gate Arrays (FPGA), etc. The controller 110 may comprise a memory. The controller 110 may be a system dedicated to the radiation source 110. Alternatively, the controller 110 may be a more general system that also serves other functional modules in the lithographic apparatus of FIG. 1A. In one embodiment, the controller 110 and the processor PR are provided by a single processor or controller.

The radiation source 100 further comprises combining optics 120. Combining optics 120 are arranged to receive the radiation beams $B_1$-$B_5$ output by each of the plurality of light emitting diodes 101-105. The combining optics 120 are operable to combine each of the plurality of radiation beams $B_1$-$B_5$ and to output a single radiation beam 121.

The combining optics 120 may comprise one or more dichroic mirrors, each of which is arranged to receive two input radiation beams and to output at least one radiation beam comprising a portion of each of the two input radiation beams. Such an arrangement is shown in FIG. 4.

Figure 4:
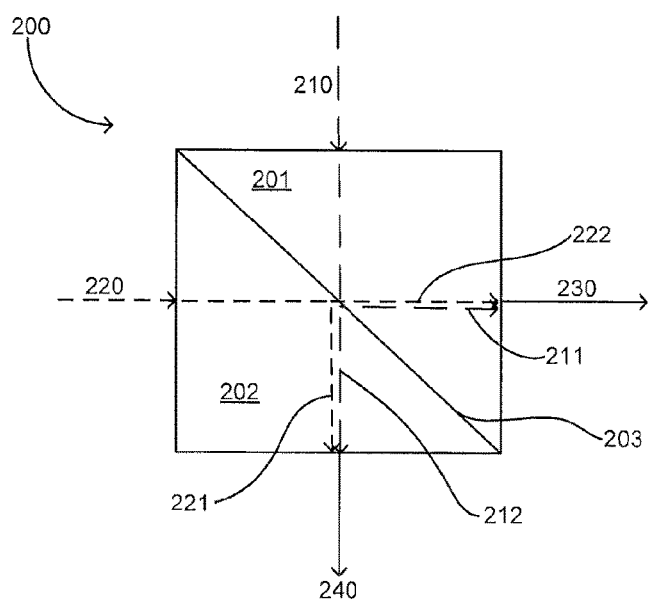
FIG. 4 schematically illustrates beam combining optics that may form part of the radiation source shown in FIG. 3.

FIG. 4 shows a dichroic mirror 200 arranged to receive two input radiation beams 210, 220. Dichroic mirror 200 (also known as a beam splitter) comprises two portions 201, 202, which meet at an intersection plane 203. Each of the input radiation beams 210, 220 is incident upon the intersection plane 203. A first portion 211, 221 of each of the input radiation beams 210, 220 is reflected from the intersection plane 203 and exits the dichroic mirror 200. A second portion 212, 222 of each of the input radiation beams 210, 220 passes through the intersection plane 203 and exits the dichroic mirror 200. The first portion 211 of the first input radiation beam 210 and the second portion 222 of the second radiation beam 220 form a first output radiation beam 230. Similarly, a second portion 212 of the first radiation beam 210 and a first portion 221 of the second radiation beam 220 form a second output radiation beam 240.

The characteristics of such a dichroic mirror 200 as shown in FIG. 4 may be tuned with respect to the wavelengths of the two input radiation beams 210, 220 so as to at least partially suppress one of the output radiation beams 230, 240. Such an arrangement would produce one main output radiation beam which comprises a combination of the two input radiation beams. For example, a coating is provided at the intersection plane 203. The material and thickness of this coating are chosen such that, for example, it has a high transmission for radiation with a wavelength of the first input radiation beam 210 and high reflection for radiation with a wavelength of the second input radiation beam 220. With such an arrangement, a majority of the radiation from the first and second input radiation beams 210, 220 contributes to the second output radiation beam 240 and the first output radiation beam 230 is suppressed. Alternatively, the properties of the coating at the intersection plane 203 may be chosen such that the second output radiation beam 240 is suppressed and the majority of the radiation from the first and second input radiation beams 210, 220 contributes to the first output radiation beam 230. It will be appreciated that in an alternative embodiment the cube arrangement for dichroic mirror 200 shown in FIG. 4 may be replaced by a plate with suitable optical properties.

The combining optics 120 may be operable to produce a combined radiation beam 121 that provides a generally uniform spatial distribution of wavelength spectrum over the patterning device 20. That is, each different spatial location on the patterning device 20 (or each first grating 20 for embodiments comprising more than one topography measurement system TMS) receives radiation with substantially the same wavelength spectrum.

Optionally, the topography measurement system TMS may further comprise a spectrum detector, as now described. In general, the spectrum detector may be operable to determine characteristics of the wavelength spectrum of the radiation beam within the topography measurement system TMS. In the embodiment shown in FIG. 3, radiation source 100 further comprises: a beam splitter 130, separating optics 140 and a plurality of photodiodes 151-155.

The beam splitter 130 may be arranged to divert a portion of radiation beam 121 to a separating optics 140. The remainder of radiation beam 121 may be transmitted by beam splitter 130 and may form an output radiation beam $B_{out}$ of the radiation source 100. For example in one embodiment 99% of the radiation contained in radiation beam 121 may be output as output radiation beam $B_{out}$, and 1% of the radiation beam 121 may be diverted to the separating optics 140 by beam splitter 130.

The separating optics 140 may be arranged to separate the portion 122 of radiation beam 121 which it receives into a plurality of constituent spectral components. For example, separating optics 140 may comprise a dispersive optical element such as a prism. In particular, the separating optics 140 may be operable to spatially separate each of the components in radiation beam 122 which originated from each of the different light emitting diodes 101-105. The separating optics 140 is operable to output a plurality of output radiation beams 141-145, each of the radiation beams 141-145 corresponding to a component that originated from a different one of the light emitting diodes 101-105 respectively.

Each of the photodiodes 151-155 is arranged to receive a different one of the radiation beams 141-145 output by the separating optics 140. Each of the photodiodes 151-155 may be considered to be a detecting element which is operable to determine a power or intensity of one of the plurality of radiation beams 141-145 output by the separating optics 140. Each of the photodiodes 151-155 is operable to output a signal 161-165 indicative of an intensity of the radiation beam 141-145 that it receives from the separating optics 140. Each of the output signals 161-165 are received by controller 110.

The beam splitter 130, the separating optics 140, the photodiodes 151-155 may be considered to form a spectrum detector 170 that is operable to determine characteristics of the wavelength spectrum of the radiation beam $B_{out}$. In the example embodiment illustrated in FIG. 3, the spectrum detector 170 may be considered to be part of the radiation source 100. In alternative embodiments, the beam splitter of the spectrum detector may be disposed at any suitable point in the topography measurement system TMS, for example any position between the radiation source 2 and the detector 18. For such alternative embodiments, the spectrum detector may be considered to be separate from the radiation source 100. For example, in one alternative embodiment, the beam splitter may be disposed between the grating 16 and the detector 18.

In an alternative embodiment, the beam splitter and/or the separation optics may be omitted from the spectrum detector, as now described.

For embodiments wherein the spectrum detector does not comprise separation optics, the controller 110 may be operable to control the output of the plurality of light emitting diodes 101-105 (using suitable control signals 111-115) such that each of the light emitting diodes 101-105 is switched on in turn. For example, each of the light emitting diodes 101-105 may be pulsed in such a way that each of the light emitting diodes 101-105 is out of phase with the other light emitting diodes 101-105. With such an arrangement a single detecting element may be operable to determine a spectral component which originated from each of the different light emitting diodes 101-105 in turn.

Furthermore, in one embodiment, the spectrum detector does not comprise a beam splitter. Rather, the spectrum detector uses one or more of the detecting elements 18a, 18b of the detector 18 of the topography measurement system TMS. Again, for such an embodiment, the controller 110 may be operable to control the output of the plurality of light emitting diodes 101-105 (using suitable control signals 111-115) such that each of the light emitting diodes 101-105 is switched on in turn. For example, each of the light emitting diodes 101-105 may be pulsed in such a way that each of the light emitting diodes 101-105 is out of phase with the other light emitting diodes 101-105. With such an arrangement one or more of the detecting elements 18a, 18b of the detector 18 of the topography measurement system TMS may be operable to determine a spectral component which originated from each of the different light emitting diodes 101-105 in turn. Such an embodiment of a spectrum detector may be beneficial since it does not require a beam splitter or separation optics and is therefore a particularly simple design.

The transmission of radiation by the substrate 12 in topography measurement system TMS as a function of wavelength is dependent on the shape of the surface of the substrate 12. Therefore, for embodiments wherein the characteristics of the wavelength spectrum of the radiation beam are determined downstream of the substrate 12, such measurements are desirably made using a reference substrate that has a substantially constant or known surface. During such measurements of characteristics of the wavelength spectrum of the radiation beam the reference substrate may remain stationary. For example, a constant or known reference substrate may be used for embodiments wherein the spectrum detector uses one or more of the detecting elements 18a, 18b of the detector 18 of the topography measurement system TMS or for embodiments wherein the beam splitter of the spectrum detector is disposed between the grating 16 and the detector 18.

The spectrum detector may be operable to determine the wavelength spectrum of the radiation beam $B_{out}$ output by the radiation source 100 (or a radiation beam at any point in the topography measurement system TMS). The spectrum detector may be used as part of a feedback control loop to stabilise the wavelength spectrum of the radiation beam $B_{out}$ output by the radiation source 100 (or, alternatively, at another point in the topography measurement system TMS).

The radiation source 100 described has a number of advantages, as now described.

The radiation source 100 allows for the wavelength spectrum of the radiation source 2 used in the topography measurement system TMS to be adjusted. By varying the control signals 111-115 sent to the light emitting diodes 101-105, the controller 110 is operable to control the wavelength spectrum of the radiation beam $B_{out}$ output by the radiation source 100. In particular this can be achieved online, i.e. in real time during operation of the lithographic apparatus.

Furthermore, a feedback loop formed by the spectrum detector (for example spectrum detector 170) and the controller 110 may be used to determine any changes or differences in spectral output of light emitting diodes 101-105 and/or spectral transmission of optics between (a) the light emitting diodes 101-105 and (b) either a beam splitter (for example beam splitter 130) of the spectrum detector or a detector (for example detector 18) of the spectrum detector. The controller 110 may be operable to control the control signals 111-115 sent to the light emitting diodes 101-105 in dependence on signals received by the controller 110 from the spectrum detector (for example, the signals 161-165 from the photodiodes 151-155). For example, the controller 110 may be operable to control the control signals 111-115 sent to the light emitting diodes 101-105 so as to at least partially correct for any determined changes or differences in the spectrum of the radiation beam $B_{out}$ output by the radiation source 100. In this way, the wavelength spectrum of the radiation beam $B_{out}$ output by the radiation source 100 may be stabilised. Additionally or alternatively, for embodiments wherein the detector 18 forms part of the spectrum detector, spectral changes in the optical path between the radiation source 2 and the detector 18 can be measured and/or corrected.

As described above, in some embodiments, the controller 110 may be operable to control the output of the plurality of light emitting diodes 101-105 (using suitable control signals 111-115) such that each of the light emitting diodes 101-105 is pulsed. Since ultraviolet light emitting diodes are capable of being instantly switched on or off, they can be pulsed at very high frequencies. In particular, each of the light emitting diodes 101-105 may be pulsed in such a way that each of the light emitting diodes 101-105 is out of phase with the other light emitting diodes 101-105. In this way, the output of the radiation source 100 may produce a plurality of pulses, wherein the pulses cycle through a plurality of different wavelengths. This high frequency wavelength switching therefore provides a wavelength modulation of the output radiation beam $B_{out}$.

This frequency wavelength switching can be exploited by the spectrum detector to avoid the use of separating optics, as explained in detail above. The high frequency wavelength switching that can be achieved using ultraviolet light emitting diodes can also be advantageous during the measurement of the topography of a substrate 12 using the topography measurement system TMS, as now described.

Desirably, the frequency at which each of the light emitting diodes 101-105 is pulsed is sufficiently high that, during operation of the topography measurement system TMS, the target location 19 moves a negligible amount during the time period of each pulsed light emitting diode 101-105. If the detector 18 is able to temporally resolve each pulse then the processor PR may be operable to determine a plurality of height maps simultaneously (i.e. during a single scan of the substrate 12 below the topography measurement system TMS), each of the plurality of height maps being determined using a different wavelength (i.e. from a different light emitting diode). Therefore, with such an arrangement, the topography measurement system TMS allows a plurality of substrate height maps to be acquired, using multiple wavelengths, without loss of throughput of the lithography apparatus. The plurality of height maps may be combined to improve the accuracy of the measurement. Alternatively, the height map that was determined using an optimal (best performing) wavelength may be selected.

A memory of the controller 110 may be operable to store information relating to signals that provide a default or optimum wavelength spectrum for the radiation beam $B_{out}$.

The topography measurement system TMS can have one or more advantages. It uses ultraviolet radiation, which has been found to provide better accuracy of the topography measurement system TMS than visible or infrared radiation. Furthermore, ultraviolet light emitting diodes have one or more advantages over other known ultraviolet radiation sources such as gas discharge lamps (e.g. a Xenon plasma source). In particular, an ultraviolet light emitting diode generates less heat and is therefore more efficient. Furthermore, an ultraviolet light emitting diode may produce significantly less ozone than a Xenon plasma source (which needs to be purged, for example using nitrogen). For example, at least some ultraviolet light emitting diodes may not produce any ozone, in contrast to Xenon plasma sources.

Furthermore, an ultraviolet light emitting diode can be switched on and off easily without significantly affecting its lifetime, which may avoid the need for a complicated shutter arrangement. In addition, an ultraviolet light emitting diode can be switched at high frequency such that the wavelength of the radiation beam can be modulated. Furthermore, light emitting diodes, particularly ultraviolet light emitting diodes, are more widely available and less expensive than more complicated gas discharge sources.

Since, in an embodiment, the topography measurement system TMS uses ultraviolet radiation, as opposed to visible or infrared radiation, for example with a spectral range of around 225 nm to 400 nm, there may be a risk of pre-exposure of the resist on the substrate 12. This is because the spectral intensity distribution of the topography measurement system TMS overlaps with the sensitivity of many of the resists used with a deep ultraviolet (for example operating at an exposure wavelength of around 193 nm) or extreme ultraviolet (for example operating at an exposure wavelength of around 13.5 nm) lithographic apparatus.

As explained above, in order to mitigate the risk of such pre-exposure of the resist, it may be desirable to provide a radiation source 100 whose output can be relatively easily controlled.

In an embodiment, the radiation source 100 may have a plurality of different operational modes, the spectral intensity distribution of the radiation beam $B_{out}$ being dependent on a selected operational mode. The controller 110 may be operable to produce a different set of the plurality of control signals 111-115 for each of the plurality of operational modes. That is to say that in each different operational mode, a different set of control signals 111-115 is produced. That is, for each pair of two operational modes at least one of the plurality of control signals 111-115 that is received by one of the plurality of light emitting diodes 101-105 is different. In this way, the spectral intensity distribution of the radiation beam $B_{out}$ is dependent on the selected operational mode of the controller 110.

In an embodiment, the radiation source 100 may have two different operational modes: a first operational mode and a second operational mode.

When in the first operational mode, the radiation source 100 may provide broadband ultraviolet radiation, for example in the range of 200 nm-425 nm, which may be used for determining a topography (for example a height map) of the substrate 12. As described above, such a broadband ultraviolet spectral intensity distribution can result in an improvement of the performance of the topography measurement system TMS (i.e. a more accurate determination of the topography of the substrate 12). Therefore, the first operational mode may be used when determining the topography of the substrate 12 (i.e. when measuring a height map of the substrate 12).

When in the second operational mode, the radiation source 100 may provide ultraviolet radiation with a reduced spectral range relative to the first operational mode. For example, a spectral range of radiation emitted when the radiation source 100 is in the second operational mode may be a subrange of a spectral range of radiation emitted when the radiation source 100 is in the second operational mode. In particular, in the second operational mode, the radiation source 100 may provide ultraviolet radiation wherein the intensity of radiation emitted in a shorter wavelength portion of the spectrum is reduced. For example, in the second operational mode, the radiation source 100 may provide ultraviolet radiation only in the range of 325 nm-425 nm. A spectral intensity distribution of radiation emitted when the radiation source 100 is in the second operational mode may be reduced relative to a spectral intensity distribution of radiation emitted when the radiation source 100 is in the first operational mode in a lower wavelength portion of the spectral intensity distribution. Generally, resists that are used on the substrate 12 are more sensitive to radiation in the shorter wavelength subrange of the radiation source 100 than in the longer wavelength subrange of the radiation source 100. Therefore, by reducing the intensity of radiation emitted in the shorter wavelength portion of the spectrum, the risk of pre-exposing the resist may be reduced. Therefore, the second operational mode may be used in situations where a reduction in the overall performance of the topography measurement system TMS can be tolerated so as to mitigate the risk of pre-exposing the resist. For example, the second operational mode may be used when one or more preliminary measurements are being made using the topography measurement system TMS prior to a determination of the topography of the substrate 12, for example during wafer capture.

Figure 5:
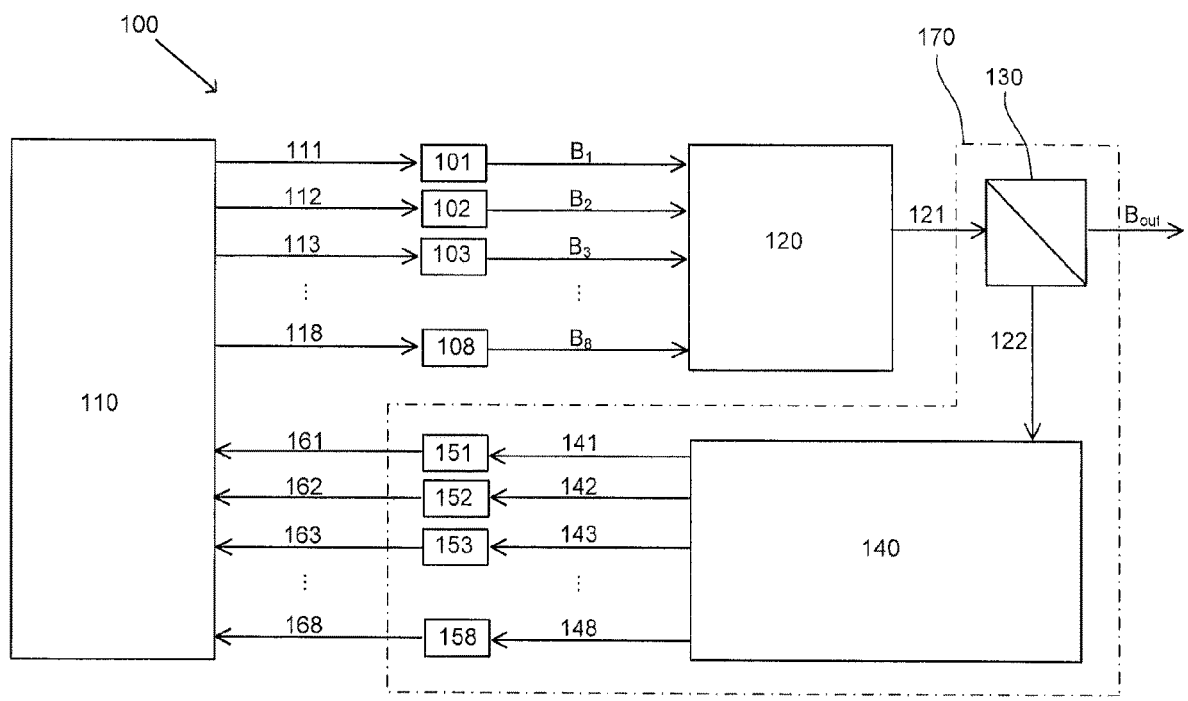
FIG. 5 schematically illustrates a radiation source according to an embodiment that may form part of the topography measurement system shown in FIG. 2.

An example embodiment wherein the controller 110 has two operational modes is now described with reference to FIGS. 5, 6A and 6B.

As already explained above, although the specific embodiment of the radiation source 100 shown in FIG. 3 comprises five light emitting diodes, it will be appreciated that other embodiments may comprise fewer than or more than five light emitting diodes. FIG. 5 is a schematic diagram of a radiation source 100 for a topography measurement system TMS which is generally of the form of the radiation source shown in FIG. 3 and described above. The differences between the radiation source 100 shown in FIG. 5 and the radiation source 100 shown in FIG. 3 are that: the radiation source 100 shown in FIG. 5 comprises eight light emitting diodes 101-108; the controller 110 is operable to produce eight control signals 111-118, each of which is received by a different one of the eight light emitting diodes 101-108 respectively; the separating optics 140 is arranged to separate the portion 122 of radiation beam 121 which it receives from the beam splitter 130 into eight output radiation beams 141-148, each of is a spectral component that originated from a different one of the light emitting diodes 101-108; and the radiation source 100 shown in FIG. 5 comprises eight photodiodes 151-158, each arranged to receive a different one of the radiation beams 141-148 output by the separating optics 140 and operable to output a signal 161-168 to the controller 110 that is indicative of an intensity of the radiation beam 141-148 that it receives from the separating optics 140.

The controller 110 has two operational modes. FIG. 6A shows the spectral intensity distribution 300 (solid line) of the radiation source 100 in a first operational mode. FIG. 6A also shows the spectral intensity distributions 301-308 for each of the eight light emitting diodes 101-108 of the radiation source 100 in the first operational mode. FIG. 6B shows the spectral intensity distribution 310 (solid line) of the radiation source 100 in a second operational mode. FIG. 6B also shows the spectral intensity distributions 305-308 for four of the light emitting diodes 105-108, which contribute to the spectral intensity distribution 310 of the radiation source 100 in the second operational mode.

Figure 6A:
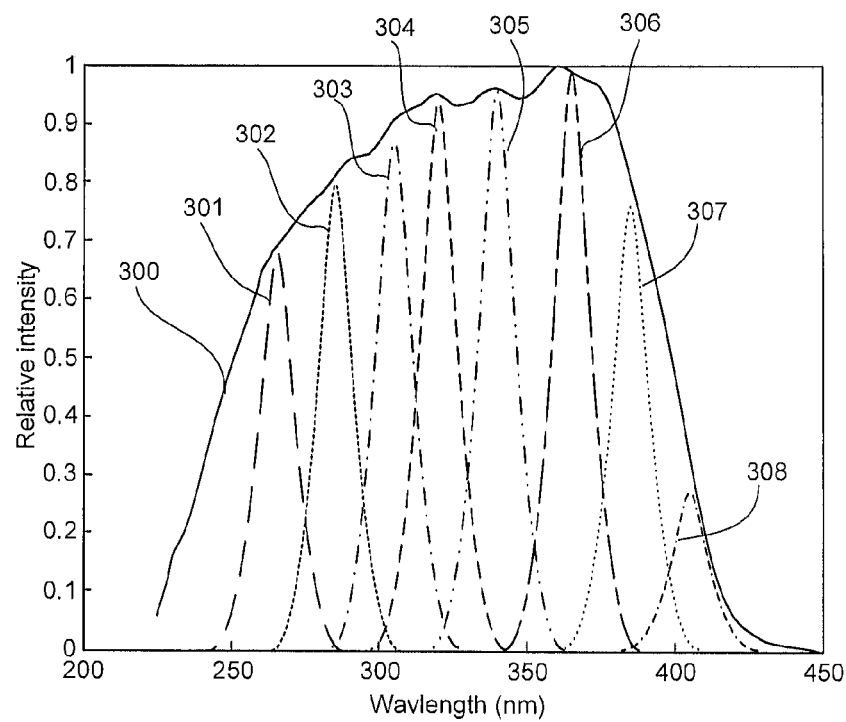
FIG. 6A shows the spectral intensity distribution (solid line) of the radiation source of FIG. 5 in a first operational mode and the spectral intensity distribution for each of the eight light emitting diodes of the radiation source in the first operational mode.
Figure 6B:
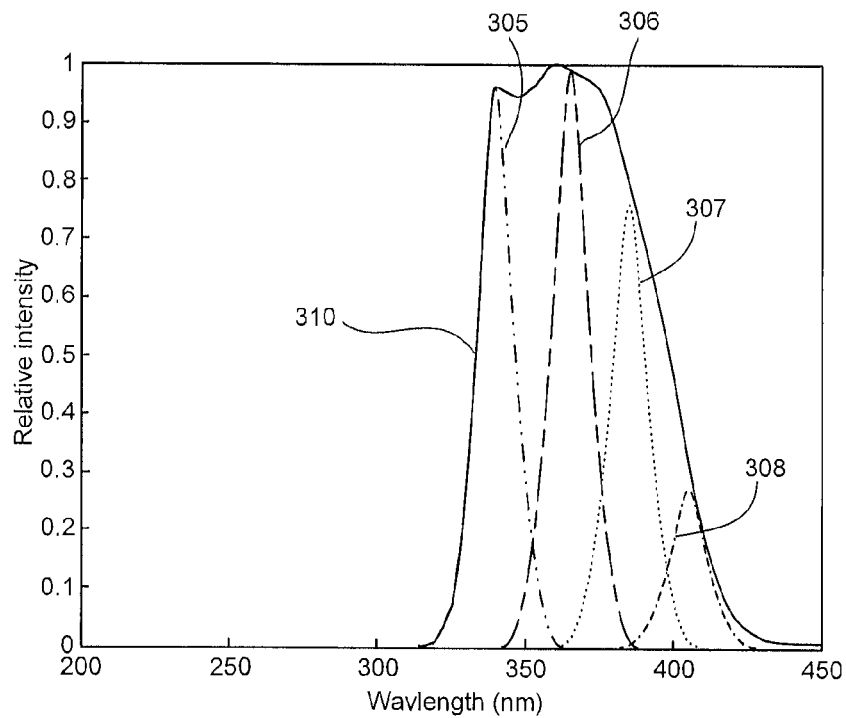
FIG. 6B shows the spectral intensity distribution (solid line) of the radiation source of FIG. 5 in a second operational mode and the spectral intensity distribution for each of the eight light emitting diodes of the radiation source in the second operational mode.

In the embodiment shown in FIGS. 6A and 6B, the spectral intensity distribution of each of the light emitting diodes 101-108 is Gaussian-like and the central wavelengths of the radiation beams $B_1$-$B_8$ are approximately: 265 nm, 280 nm, 305 nm, 320 nm, 340 nm, 365 nm, 385 nm and 405 nm respectively. Light emitting diodes having a central wavelength of, for instance, about 515 nm, about 612 nm, about 782 nm or about 880 nm may also be used with a Gaussian-like spectral intensity distribution or a different distribution. Light emitting diodes having other central wavelengths may also be used.

In the first operational mode, the controller 110 is operable to produce a first set of the plurality of control signals 111-118 such that the radiation beam $B_{out}$ has the spectral intensity distribution 300 shown in FIG. 6A. To achieve this, the controller 110 is operable to produce a first set of the plurality of control signals 111-118 such that each of the light emitting diodes 101-108 emits radiation. As can be seen from FIG. 6A, although the intensity of radiation emitted by each of the light emitting diodes 101-108 is of the same order of magnitude, there is some variation in the peak intensities of the light emitting diodes 101-108. The spectral intensity distribution 300 is broadband ultraviolet radiation, for example in the range of approximately 225 nm-425 nm. Such a broadband ultraviolet spectral intensity distribution can result in an improvement of the performance of the topography measurement system TMS (i.e. a more accurate determination of the topography of the substrate 12). In particular, the lower wavelength portion of the spectral range results in an improvement of the performance of the topography measurement system TMS.

In the second operational mode, the controller 110 is operable to produce a second set of the plurality of control signals 111-118 such that the radiation beam $B_{out}$ has the spectral intensity distribution 310 shown in FIG. 6B. The spectral intensity distribution 310 of radiation emitted when the radiation source 100 is in the second operational mode is reduced relative to the spectral intensity distribution 300 of radiation emitted when the radiation source 100 is in the first operational mode in a lower wavelength portion of the spectral intensity distribution 300. To achieve this, the controller 110 is operable to produce a first set of the plurality of control signals 111-118 such that the four light emitting diodes 101-104 with the lowest central wavelengths do not emit radiation and the four light emitting diodes 105-108 with the highest central wavelengths each emits radiation. As can be seen from FIG. 6B, this results in a truncated spectral intensity distribution 310, relative to the spectral intensity distribution 300 of the first operational mode, wherein the lower portion of the spectrum is effectively switched off. When in the second operational mode, the radiation source 100 therefore provides ultraviolet radiation with a reduced spectral range relative to the first operational mode. A spectral range of radiation emitted when the radiation source 100 is in the second operational mode is a subrange of a spectral range of radiation emitted when the radiation source 100 is in the second operational mode. In particular, in the second operational mode, the radiation source 100 provides ultraviolet radiation wherein the intensity of radiation emitted in a shorter wavelength portion of the spectral range is reduced. As explained above, by reducing the intensity of radiation emitted in the shorter wavelength portion of the spectral range, the risk of pre-exposing the resist may be reduced.

Figure 7:
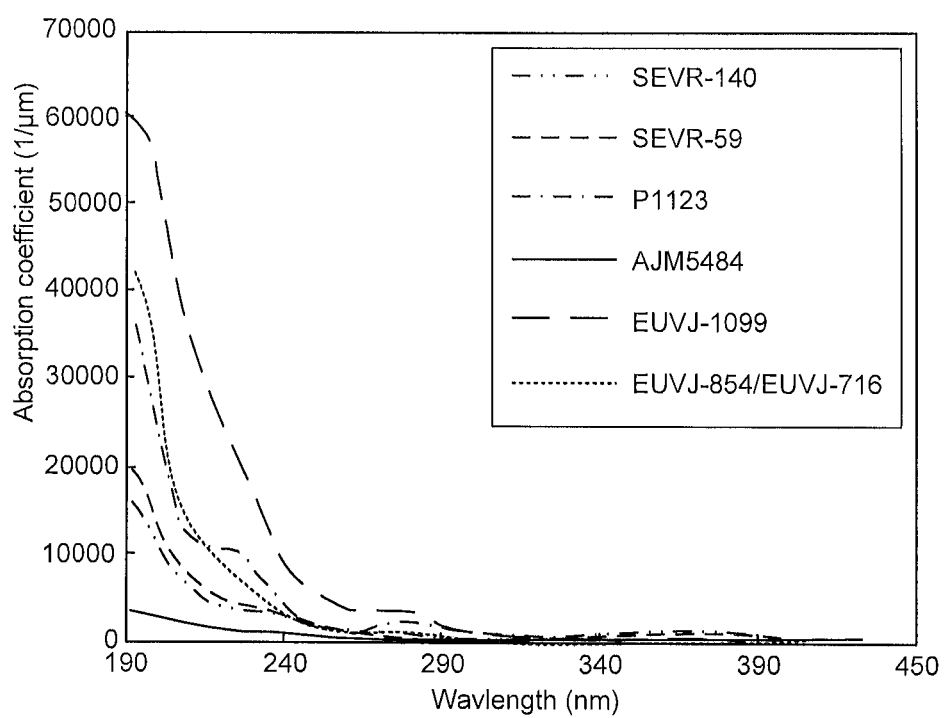
FIG. 7 shows the absorption coefficient as a function of wavelength for some resists that are used with deep ultraviolet and extreme ultraviolet lithographic apparatus.

FIG. 7 shows the absorption coefficient as a function of wavelength of some resists that are used with a deep ultraviolet (for example operating at an exposure wavelength of around 193 nm) and extreme ultraviolet (for example operating at an exposure wavelength of around 13.5 nm) lithographic apparatus. As can be seen from FIG. 7, for all of these resists, the absorption coefficient decreases with increasing wavelength. Furthermore, for all of these resists the absorption coefficient falls to a negligible level for wavelengths above around 290 nm. Since the spectral intensity distribution 310 of the radiation source 100 in a second operational mode (see FIG. 6B) falls to zero at a wavelength of around 310 nm, the risk of pre-exposure of the resist when the radiation source 100 is operating in the second mode is significantly reduced when the radiation source 100 is operating in the second operational mode.

Although specific reference may be made in this text to embodiments in the context of a lithographic apparatus, embodiments may be used in other apparatus. Embodiments may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The illumination optics, optics and detection optics may encompass various types of optical components, including refractive, reflective, and catadioptric optical components for directing, shaping, or controlling the beam of radiation.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Embodiments may be implemented in hardware, firmware, software, or any combination thereof. The processor PR may be connected to a memory which stores processor readable instructions that when executed will apply a decoding sequence to a signal output from the detector 18. Embodiments may also be implemented as instructions stored on a computer-readable medium, which may be read and executed by one or more processors. A computer-readable medium may include any mechanism for storing or transmitting information in a form readable by a machine (e.g., a computing device). For example, a computer-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A measurement system for determining a topography of a substrate, the system comprising:
 a radiation source configured to generate a radiation beam, the radiation source comprising a plurality of light emitting diodes to provide the radiation of the radiation beam, at least two of the plurality of light emitting diodes having different wavelength spectra;

a first patterning device configured to pattern the radiation beam;

optics configured to form an image of the first patterning device at a target location on the substrate, where the substrate is arranged to move relative to the image of the first patterning device such that the target location moves relative to the substrate;

detection optics configured to receive radiation reflected from the target location of the substrate and form an image of the first patterning device at a grating;

a detector configured to receive radiation transmitted through the grating and produce an output signal; and one or more controllers configured to control the radiation source to provide the radiation in the presence of a resist-covered substrate in each of a first operational mode and a second operational mode, wherein in the first operational mode the radiation beam has a first spectral intensity distribution providing enhanced performance of the measurement system with respect to the second operational mode in which the radiation beam has a second spectral intensity distribution, different from the first spectral intensity distribution, which provides a reduction of a risk of pre-exposure of the resist covering the substrate in the second operation mode.

2. The measurement system of claim 1, wherein the one or more controllers are further configured to produce a plurality of control signals, each of which is received by a different one of the plurality of light emitting diodes, an output intensity or power of each light emitting diode being dependent on the control signal it receives from the one or more controllers, wherein the one or more controllers is configured to control the output of the plurality of light emitting diodes such that each of the light emitting diodes is pulsed.

3. The measurement system of claim 2, wherein each of the light emitting diodes is pulsed in such a way that the pulses from each of the light emitting diodes is out of phase with the pulses of the light emitting diodes that have a different wavelength spectra.

4. The measurement system of claim 2, wherein the detector is able to temporally resolve each pulse.

5. The measurement system of claim 1, wherein the radiation source further comprises combining optics arranged to receive radiation from each of the plurality of light emitting diodes and to combine it such that radiation from each of the plurality of light emitting diodes spatially overlaps to form a radiation beam.

6. The measurement system of claim 5, wherein the combining optics comprises one or more dichroic mirrors arranged to receive two input radiation beams and to output at least one radiation beam comprising a portion of each of the two input radiation beams.

7. The measurement system of claim 1, wherein the radiation beam comprises ultraviolet radiation in the range of 200 nm-425 nm.

8. The measurement system of claim 1, further comprising:

combining optics arranged to receive radiation from each of the plurality of light emitting diodes and to combine it such that radiation from each of the plurality of light emitting diodes spatially overlaps to form a radiation beam; and the one or more controllers are further configured to produce a plurality of control signals, each control signal of which is received by a different one of the plurality of light emitting diodes, an output intensity or power of each light emitting diode being dependent on the control signal it receives from the one or more controllers.

9. A lithographic apparatus comprising:

a support constructed to support a second patterning device, the second patterning device being capable of imparting another radiation beam with a pattern in its cross-section to form a patterned radiation beam;

a substrate table constructed to hold a substrate;

a projection system configured to project the patterned radiation beam onto a target portion of the substrate; and the measurement system according to claim 1.

10. A measurement apparatus comprising a plurality of measurement systems according to claim 1, wherein the plurality of measurement systems share a common radiation source.

11. The measurement system of claim 1, wherein the second spectral intensity distribution is reduced relative to the first spectral intensity distribution in a lower wavelength portion of the first spectral intensity distribution.

12. The measurement system of claim 1, wherein the first spectral intensity distribution is in a range of 200 nm to 425 nm and the second spectral intensity distribution is in a range of 325 nm to 425 nm.

13. The measurement system of claim 1, wherein, during an operation of the measurement system, the first spectral intensity distribution is used to determine the topography of the substrate and the second spectral intensity distribution is used prior to determination of the topography of the substrate.

14. The measurement system of claim 1, further comprising a spectrum detector configured to determine a characteristic of the wavelength spectrum of the radiation beam, the spectrum detector comprising a detecting element.

15. The measurement system of claim 14, wherein the detecting element is provided by the detector.

16. The measurement system of claim 14, wherein the detecting element is separate from the detector and wherein the spectrum detector comprises a beam splitter arranged to divert a portion of the radiation beam to the detecting element.

17. The measurement system of claim 14, wherein the spectrum detector comprises:

separating optics arranged to separate at least a portion of the radiation beam which it receives into a plurality of constituent spectral components; and a plurality of detecting elements, each of which is configured to determine a power or intensity of a different one of the plurality of constituent spectral components.

18. The measurement system of claim 14, wherein the spectrum detector is configured to output one or more signals indicative of a characteristic of the wavelength spectrum of the radiation beam.

19. The measurement system of claim 18, wherein the one or more controllers are further configured to produce a plurality of control signals, each of which is received by a different one of the plurality of light emitting diodes, an output intensity or power of each light emitting diode being dependent on the control signal it receives from the controller, wherein the one or more signals output by the spectrum detector is received by the one or more controllers and the control signals are generated by the one or more controllers based thereon.

20. The measurement system of claim 1, further comprising a processor configured to determine a height of the substrate based on the output signal.

21. A measurement system for determining a topography of a substrate, the system comprising:

a radiation source configured to generate a radiation beam, the radiation source comprising a plurality of light emitting diodes to provide the radiation of the radiation beam, at least two of the plurality of light emitting diodes having different wavelength spectra;

a first patterning device configured to pattern the radiation beam;

optics configured to form an image of the first patterning device at a target location on the substrate, where the substrate is arranged to move relative to the image of the first patterning device such that the target location moves relative to the substrate;

detection optics configured to receive radiation reflected from the target location of the substrate and form an image of the first patterning device at a grating;

a detector configured to receive radiation transmitted through the grating and produce an output signal; and one or more controllers configured to control the radiation source to provide the radiation in each of a first operational mode and a second operational mode, wherein in the first operational mode the radiation beam has a first spectral intensity distribution comprising radiation having wavelength of 340 nm or less providing enhanced performance of the measurement system with respect to the second operational mode in which the radiation beam has a second spectral intensity distribution, different from the first spectral intensity distribution, having a wavelength of 340 nm or less which provides a reduction of a risk of pre-exposure of a resist covering the substrate.

* * * * *